United States Patent [19]
Sheng et al.

[11] Patent Number: 5,846,865
[45] Date of Patent: Dec. 8, 1998

[54] METHOD OF FABRICATING FLAT-CELL MASK READ-ONLY MEMORY (ROM) DEVICES

[75] Inventors: Yi-Chung Sheng, Taichung; Cheng-Hui Chung, Hsinchu Hsien; Jih-Wen Chou, Hsinchu, all of Taiwan

[73] Assignee: United Microelectronics Corp., Hsinchu, Taiwan

[21] Appl. No.: 745,468

[22] Filed: Nov. 12, 1996

[51] Int. Cl.$^6$ .................................................. H01L 21/8236
[52] U.S. Cl. .......................... 438/276; 438/587; 438/592; 148/DIG. 20
[58] Field of Search ...................................... 438/276, 585, 438/587, 588, 592, 672, 674, 675; 148/DIG. 20

[56] References Cited

U.S. PATENT DOCUMENTS

| | | | |
|---|---|---|---|
| 4,520,552 | 6/1985 | Arnould et al. | 438/672 |
| 4,587,712 | 5/1986 | Baliga | 438/672 |
| 4,803,173 | 2/1989 | Sill et al. | 438/672 |
| 5,712,203 | 1/1998 | Hsu | 438/587 |
| 5,753,551 | 5/1998 | Sung | 438/675 |

*Primary Examiner*—Charles L. Bowers, Jr.
*Assistant Examiner*—Toniae M. Thomas
*Attorney, Agent, or Firm*—Spencer & Frank

[57] ABSTRACT

A method of fabricating flat-cell mask ROM devices having buried bit-lines that will not be subject to punch-through between neighboring bit lines as a result of heating in subsequent steps after the buried bit-lines are formed. In the method, the first step is to prepare a semiconductor substrate with a gate oxide layer formed thereon. Thereafter, a first polysilicon layer is formed over the gate oxide layer, and a plurality of trenches at predetermined positions, with these trenches extending through the gate oxide and first polysilicon layer and into the substrate to a predetermined depth. Then, trenches are filled with tungsten to form a plurality of source/drain regions. A second polysilicon layer is then formed over the first polysilicon layer, and an insulating layers is formed over each of the source/drain regions. Thereafter, a third polysilicon layer is formed over the second polysilicon layer and the insulating layers, and finally the third polysilicon layer is defined to form a gate for the integrated circuit device. Since the source/drain regions are made of tungsten metal, the spacing distance therebetween will not be changed when subjected to high-temperature conditions during subsequent process steps. The punch-through effect can thus be avoided.

12 Claims, 2 Drawing Sheets

METHOD OF FABRICATING FLAT-CELL MASK READ-ONLY MEMORY (ROM) DEVICES

BACKGROUND OF THE INVENTION

1. Field of the Invention

This invention relates to semiconductor fabrication, and more particularly, to a method of fabricating flat-cell mask read-only memory (ROM) devices having buried bit-lines that will not be subject to punch-through between neighboring bit lines.

2. Description of Related Art

Memory is an indispensable and also the most widely used device in computer-related systems. In this information age, memory devices are compact in package with high storage capacity and processing speed. Among the many forms of memory devices, the read-only memory (ROM) device is one that can retain its data when power is off. This characteristic allows the ROMs to serve as a fixed data storage device that permanently stores repeatedly used programs and/or tables of data in mini-computers as well as microprocessor-based personal computers.

Conventional methods of fabricating ROMs involve many steps which are complicated and time-consuming to perform. In general, most ROMs are similar in structure except for the various data to be permanently stored therein. Accordingly, the semiconductor manufacturer usually fabricates ROMs to a semi-finished product without performing the factory-programming step to store the permanent data. The semi-finished product is then stocked in warehouse ready to be shipped upon customer order. Unless a customer-specified program is received with the order, a factory-programming step is performed. This allows the ROM product to be delivered to the customer in a short period of time. Alternatively, the semi-finished product can be directly delivered to customers if the customers are able to do the programming themselves.

Mask ROMs with buried bit-lines are the most popular types of read-only memory. FIG. 1 shows a schematic sectional diagram of a flat-cell mask ROM device fabricated by a conventional method. This flat-cell mask ROM device is formed on a silicon substrate 10 including a plurality of source/drain regions 11, 12, 13, 14 and at least a poly-silicon gate layer 15. The source/drain regions 11, 12, 13, 14 are the so-called buried bit-lines and the polysilicon gate layer 15 serves as a word line for the mask ROM. These buried bit-lines 11, 12, 13, 14 are spaced at predetermined intervals as indicated by the reference numeral 16.

Conventionally, the buried bit-lines 11–14 are formed by doping impurities into the regions of the silicon substrate 10 which are to be the respective bit lines. When the buried bit-lines are formed, there are still quite a number of subsequent process steps that are required to complete the fabrication of the mask ROM. If the wafer is subject to high-temperature conditions in these subsequent steps, which is usually the case, then the doping impurities within the buried bit-lines will diffuse outward in all directions. As a consequence, the space 16 between neighboring buried bit-lines, for example 12 and 13, could become narrower, which would cause a punch-through to easily take place between adjacent ones of these buried bit-lines 11, 12, 13, 14.

With the advent of high-integration fabrication technologies, the packing density of the memory cells in mask ROMs can be significantly increased. This is usually achieved by reducing the feature size of individual memory cells in the mask ROMs. However, this practice also reduces the space between the aforementioned buried bit-lines in the mask ROMs. Needless to say, the adverse punch-through effect will become more apparent in such mask ROMs. There exists, therefore, a need in the semiconductor industry for a method of fabricating mask ROMs in which the buried bit-lines will be protected against punch-through.

SUMMARY OF THE INVENTION

It is therefore an objective of the present invention to provide a method for fabricating flat-cell mask ROM devices having buried bit-lines that will not be subject to punch-through between neighboring bit lines as a result of heating in the subsequent steps after the buried bit-lines are formed.

In accordance with the foregoing and other objectives of the present invention, a new and improved method for fabricating flat-cell mask ROM devices is provided. In the method, the first step is to prepare a semiconductor substrate with a gate oxide layer formed thereon. The second step is to form a first polysilicon layer over the gate oxide layer. The third step is to form a plurality of trenches at predefined positions through the gate oxide and first polysilicon layer and into the semiconductor substrate. The fourth step is to form a plurality of source/drain regions by filling the trenches with tungsten. The fifth step is to form a second polysilicon layer over the first polysilicon layer. The sixth step is to form a plurality of insulating layers over the source/drain regions. The seventh step is to form a third polysilicon layer over the second polysilicon layer and the insulating layers, and the final eighth step is to define and form the third polysilicon layer into a gate for the integrated circuit device.

The method of the present invention as briefly described in the foregoing has at least two advantages over the prior art. First, since the source/drain regions are made of tungsten metal, the spacing distance therebetween will not be changed when subjected to high-temperature conditions during subsequent process steps. The punch-through effect as occurred in the prior art can thus be avoided. Second, since the sheet resistance of tungsten is smaller than that of doped silicon, the source/drain regions formed by the method of the present invention can contribute high performance to the mask ROM thus made.

BRIEF DESCRIPTION OF DRAWINGS

The invention can be more fully understood from the following detailed description of the preferred embodiments, with reference made to the accompanying drawings, wherein.

DETAILED DESCRIPTION OF PREFERRED EMBODIMENT

FIGS. 2A–2E are schematic sectional diagrams used to depict the steps involved in the method according to the present invention for fabricating a flat-cell mask ROM device having a plurality of buried bit-lines.

Figure 1:
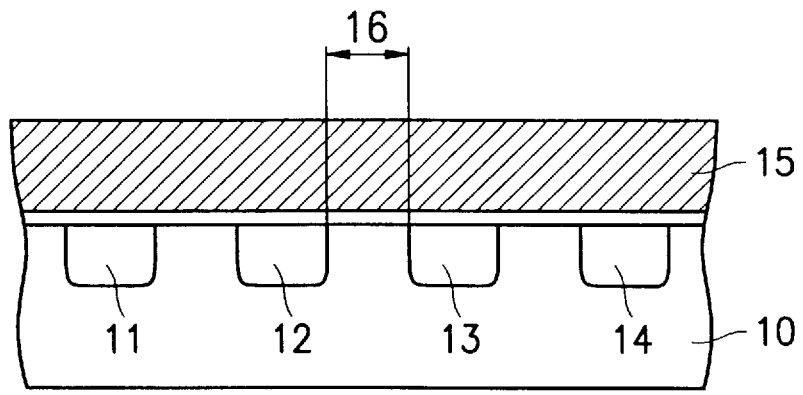
FIG. 1 is a schematic sectional diagram of a flat-cell mask ROM device fabricated by a conventional method.
Figure 2A:
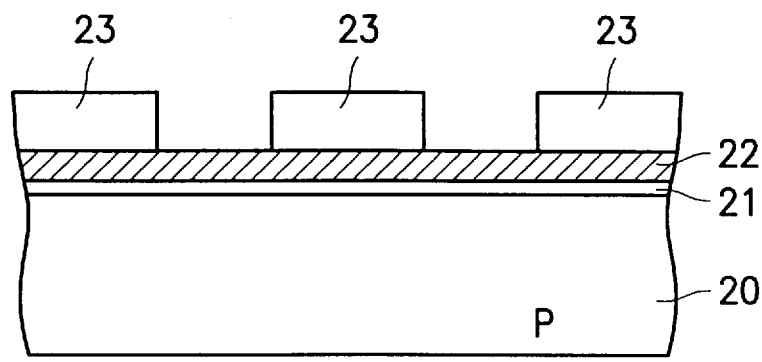
FIGS. 2A through 2E are schematic sectional diagrams used to depict the steps involved in the method according to the present invention for fabricating a flat-cell mask ROM device.

Referring first to FIG. 2A, the mask ROM is formed on a semiconductor substrate such as a p-type silicon substrate 20. A conventional method is used to define the active regions on the p-type silicon substrate 20. A gate oxide layer 21 is formed over the active region on the p-type silicon substrate 20 by, for example, dry oxidation. A polysilicon layer 22 is deposited by, for example, chemical-vapor deposition (CVD) over the gate oxide layer 21 to a thickness of about, for example 500 angstroms (Å). The purpose of forming the polysilicon layer 22 is to protect the gate oxide layer 21 against contamination in all subsequent process steps. After that, a photoresist layer 23 is coated over the upper surface of the wafer, i.e., directly onto the polysilicon layer 22, and selectively removed to define the shape, size, and location of a plurality of source/drain regions (i.e., the buried bit-lines) on the wafer, and in particular in the substrate 20.

Figure 2B:
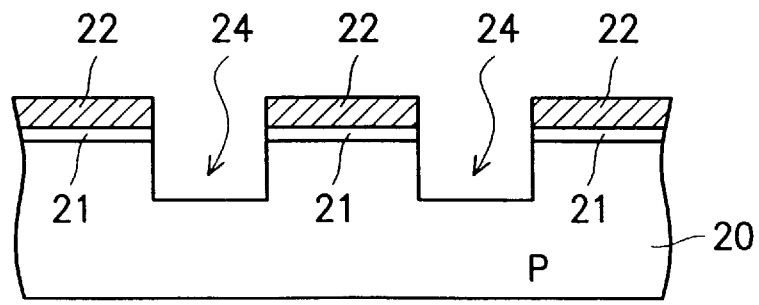

Thereafter, as shown in FIG. 2B, in the subsequent step an etching process, such as dry etching, is conducted on the wafer using the photoresist layer 23 in FIG. 2A as a mask so as to form a plurality of trenches 24 in the wafer which extends through the layers 21 and 22 and into the p-type silicon substrate 20 with a controlled depth. The depth of the trenches 24 is in the range from about 0.12 m to 0.15 m. After that, the photoresist layer 23 is removed.

Figure 2C:
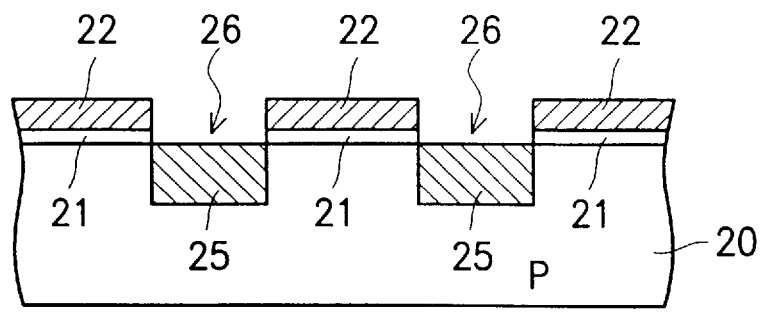

Referring next to FIG. 2C, in the subsequent step tungsten is deposited over the wafer, filling up only the bottom part of the trenches 24 (FIG. 2B) that lie in the silicon substrate 20. In this step, the tungsten is also deposited on the surface of the polysilicon layer 22. After the deposition, the wafer surface is etched back so as to adjust the level of the filled tungsten in the trenches 24 (FIG. 2B) to substantially coincide with the top surface of the p-type silicon substrate 20. The remaining layers of tungsten, as indicated by the reference numeral 25 serve as a plurality of bit-lines for the mask ROM. The top portions 26 of the original trenches 24, i.e., the positions in the layer 21 and 22, are still left unfilled. In the etch back process, the portions of the tungsten layer that were deposited on the polysilicon layer 22 are also partly removed. It is to be noted that the etch back process should be controlled in such a manner as to not allow the remaining tungsten layers over the polysilicon layer 22 to become short-circuited to the polysilicon layer 22.

Figure 2D:
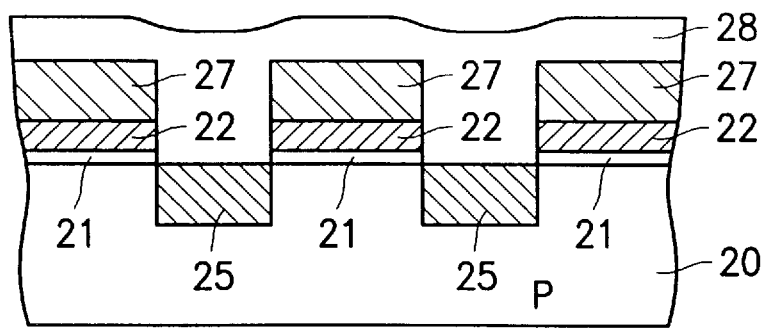

Turning now to FIG. 2D, in the subsequent step an epitaxial process is conducted on the wafer for selective polysilicon growth over the polysilicon layers 22 to thereby form a plurality of epitaxial polysilicon layers 27 over the polysilicon layers 22 to a thickness of about 1,000 Å, for example. After that, a layer of insulating material 28, for example, a layer of LPTEOS (low-pressure tetraethyl orthosilicate) is formed over the entire wafer surface by chemical-vapor deposition (CVD) to a thickness of about 1,500 Å to 2,000 Å. Besides LPTEOS, the insulating material can be borophosphosilicate glass (BPSG), phosphosilicate glass, or the like. The layer 28 not only fills up the top portions 26 of the original trenches 24 but also covers the epitaxial polysilicon layers 27.

Figure 2E:
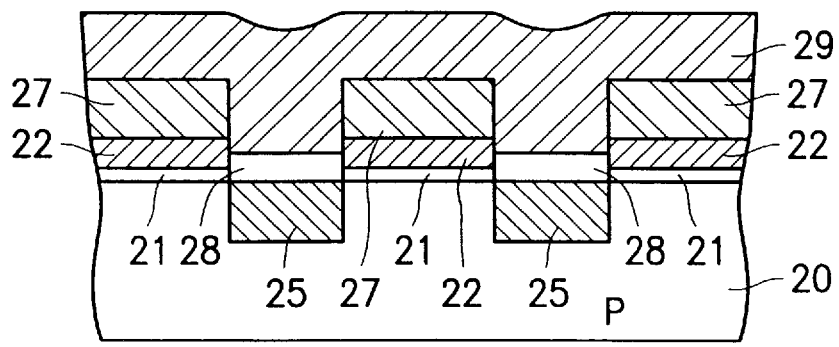

Thereafter, as shown in FIG. 2E, an etching back process is conducted on the wafer so as to remove part of the LPTEOS layer 28 until a remaining thickness of about 200 Å to 300 Å is left over the bit lines, i.e., the tungsten layers 25, with the top surface of the remaining thickness of the layer 28 substantially being leveled between the top and bottom surfaces of the polysilicon layer 22. This remaining part of the LPTEOS layer 28 serves as an insulating layer between the bit lines, i.e., the tungsten layers 25, and the word lines, i.e., a subsequently formed polysilicon layer 29. The provision of the epitaxial polysilicon layers 27 in advance is specifically used to facilitate the forming of this reduced thickness insulating layer 28. After that, as further shown in FIG. 2E, a polysilicon layer 29 is deposited by chemical-vapor deposition (CVD) over the entire surface of the wafer, covering both the epitaxial polysilicon layers 27 and the remaining part of the insulating layer 28. The polysilicon layer 29 has a thickness which preferably is in the range of about 1,000 Å to 1,500 Å. Finally, a conventional photolithographic and etching process is used to define and form the polysilicon layer 29 into predetermined patterns that serve as word lines for the mask ROM. The three polysilicon layers 22, 27, and 29 in combination serve as a gate for the mask ROM.

It is apparent to those skilled in the art of semiconductor fabrication that the method of the present invention as described in the foregoing has at least two advantages over the prior art. First, since the source/drain regions are made of tungsten metal instead of by doping impurities, the spacing distance therebetween will not be changed when the source/drain regions are subjected to high-temperature conditions during subsequent process steps. The punch-through effect as in the prior art can thus be avoided. Second, since the sheet resistance of tungsten is smaller than that of doped silicon, the source/drain regions formed by the method of the present invention can contribute high performance to the mask ROM thus made.

Further, although the method of the present invention disclosed in the foregoing is directed to the fabrication of a flat-cell mask ROM device, it can be used to form any semiconductor device in which punch-through between two conductive circuit elements due to diffusion of impurities in high-temperature conditions is not desired.

The invention has been described using exemplary preferred embodiments. However, it is to be understood that the scope of the invention is not limited to the disclosed embodiments. To the contrary, it is intended to cover various modifications and similar arrangements. The scope of the claims, therefore, should be accorded the broadest interpretation so as to encompass all such modifications and similar arrangements.

What is claimed is:

1. A method of fabricating an integrated circuit device comprising the following steps:

(1) preparing a semiconductor substrate and forming a gate oxide layer over a surface of the substrate;

(2) forming a first polysilicon layer over the gate oxide layer;

(3) forming a plurality of trenches at selected positions through the gate oxide and first polysilicon layer and into the substrate to a selected depth;

(4) filling the trenches with tungsten to form a plurality of source/drain regions;

(5) forming a second polysilicon layer over the first polysilicon layer;

(6) forming an insulating layer over each of the source/drain regions;

(7) forming a third polysilicon layer over the second polysilicon layer and over each of the insulating layers; and (8) defining and forming the third polysilicon layer into a gate.

2. The method of claim 1, wherein in said step (2), the first polysilicon layer is deposited to a thickness of about 500 Å.

3. The method of claim 1, where in said step (3), the trenches are each formed to a depth between 0.12 m and 0.15 m.

4. The method of claim 1, wherein in said step (5), the second polysilicon layer is deposited to a thickness of about 1,000 Å.

5. The method of claim 4, where in said step (5), the second polysilicon layer is grown by an epitaxial process.

6. The method of claim 1, where in said step (6), the insulating layers are each formed with a thickness between 200 Å and 300 Å.

7. The method of claim 6, wherein the insulating layers are made of low-pressure tetraethyl orthosilicate (LPTEOS).

8. The method of claim 6, wherein the insulating layers are made of borophosphosilicate glass (BPSG).

9. The method of claim 6, wherein the insulating layers are made of phosphosilicate glass.

10. The method of claim 1, where in said step (7), the third polysilicon layer is formed with a thickness between 1,000 Å and 1,500 Å.

11. The method of claim 1 wherein said step (4) of filling comprises depositing a layer of tungsten over the first polysilicon layer and into the trenches; and removing the tungsten layer so that the tungsten in the trenches extends to a height corresponding to said surface of said substrate.

12. The method of claim 11 wherein said step (6) of forming an insulating layer comprises forming each insulating layer to a thickness so that is extends within a respective trench from the surface of the associated tungsten bit line to a level between the inner and outer surface of said first polysilicon layer.

* * * * *